United States Patent
Coumou et al.

(10) Patent No.: US 12,301,199 B2
(45) Date of Patent: May 13, 2025

(54) IMPEDANCE TUNING UTILITY OF VECTOR SPACE DEFINED BY TRANSMISSION LINE QUANTITIES

(71) Applicant: Applied Materials, Inc., Santa Clara, CA (US)

(72) Inventors: David Coumou, Webster, NY (US); David Peterson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 349 days.

(21) Appl. No.: 17/737,677

(22) Filed: May 5, 2022

(65) Prior Publication Data

US 2023/0361746 A1 Nov. 9, 2023

(51) Int. Cl.
*H03H 7/40* (2006.01)
*H03F 1/56* (2006.01)

(52) U.S. Cl.
CPC .............. *H03H 7/40* (2013.01); *H03F 1/56* (2013.01)

(58) Field of Classification Search
CPC ... H03H 7/40; H03H 7/38; H03H 7/00; H03F 1/56; H03F 1/565
USPC ................................................ 333/17.1, 17.3
See application file for complete search history.

(56) References Cited

U.S. PATENT DOCUMENTS

| | | | |
|---|---|---|---|
| 9,270,250 B2* | 2/2016 | Shimomoto | H03H 7/40 |
| 10,026,594 B2* | 7/2018 | Bhutta | H01L 21/67069 |
| 2015/0244342 A1 | 8/2015 | Shimomoto et al. | |
| 2020/0126762 A1 | 4/2020 | Yang et al. | |
| 2020/0144025 A1 | 5/2020 | Radomski et al. | |

FOREIGN PATENT DOCUMENTS

| | | |
|---|---|---|
| KR | 100870121 B1 | 11/2008 |
| WO | 2020180848 A1 | 9/2020 |

OTHER PUBLICATIONS

International Search Report and Written Opinion from PCT/US2023/018371 dated Jul. 31, 2023, 10 pgs.
International Preliminary Report on Patentability for International Patent Application No. PCT/US2023/018371, dated Nov. 14, 2024, 6 pages.

* cited by examiner

*Primary Examiner* — Hai L Nguyen
(74) *Attorney, Agent, or Firm* — Schwabe, Williamson & Wyatt, P.C.

(57) ABSTRACT

Embodiments disclosed herein include a method of impedance tuning in a semiconductor processing tool. In an embodiment, the method comprises measuring a voltage and a current of a transmission line, converting an analog voltage signal and an analog current signal into a digital voltage signal and a digital current signal, calculating a u-vector from the digital voltage signal and the digital current signal, calculating a C1 position of a first capacitor with real components of the u-vector, and calculating a C2 position of a second capacitor with imaginary components of the u-vector.

14 Claims, 5 Drawing Sheets

IMPEDANCE TUNING UTILITY OF VECTOR SPACE DEFINED BY TRANSMISSION LINE QUANTITIES

BACKGROUND

1) Field

Embodiments relate to the field of semiconductor manufacturing and, in particular, to a semiconductor processing tool that is configured to provide impedance tuning with transmission line optimization.

2) Description of Related Art

In plasma processing tools, the plasma is ignited by a cathode that is coupled to processing gasses within a chamber. In most tools, a power supply is coupled to the cathode through an impedance matching network (sometimes referred to simply as a "match"). The match allows for the impedance of the system to be adjusted in order to match the impedance of the load to which the cathode is coupled. The load has a wide range of impedances that are dictated by parameters such as processing conditions, chamber architecture, and the like. Matching the impedances is important in order to provide efficient power transfer from the power supply to the load.

Impedance tuning algorithms typically are either heuristic search algorithms or model based algorithms. Heuristic searches are guided searches, and are not always guaranteed to converge on a tuned solution. Model based solutions are computationally complex. Additionally, efficiency of the tuning process is predicated on mode4887P1354I accuracy and proper gain scheduling to accelerate convergence. Scaling is also an issue since such algorithms require tailoring for each impedance match design. Further, operationally intense aspects of such algorithms make such algorithms difficult to deploy in high volume manufacturing (HVM) environments.

SUMMARY

Embodiments disclosed herein include a method of impedance tuning in a semiconductor processing tool. In an embodiment, the method comprises measuring a voltage and a current of a transmission line, converting an analog voltage signal and an analog current signal into a digital voltage signal and a digital current signal, calculating a u-vector from the digital voltage signal and the digital current signal, calculating a C1 position of a first capacitor with real components of the u-vector, and calculating a C2 position of a second capacitor with imaginary components of the u-vector.

Embodiments may also include a semiconductor processing tool. In an embodiment, the semiconductor processing tool comprises a power supply, an impedance matching network that comprises a first capacitor and a second capacitor, a cathode, a power processing module, and a sensor for measuring values including an incident voltage, an incident current, a reflected voltage, and a reflected current, and wherein the measured values are used by the power processing module to adjust the impedance of the impedance matching network.

Embodiments may also include a method of impedance tuning in a semiconductor processing tool. In an embodiment, the method may comprise measuring a voltage and a current of a transmission line, wherein the voltage comprises an incident voltage and a reflected voltage, and wherein the current comprises an incident current and a reflected current, converting an analog voltage signal and an analog current signal into a digital voltage signal and a digital current signal, calculating a u-vector from the digital voltage signal and the digital current signal, wherein the u-vector is a three element vector, calculating a C1 position of a first capacitor with real components of the u-vector, and calculating a C2 position of a second capacitor with imaginary components of the u-vector, and wherein the three elements of the u-vector yield an orientation within an impedance tuning space to match an output load condition of the semiconductor processing tool.

DETAILED DESCRIPTION

Systems described herein include a sensor for measuring voltage and current in a semiconductor tool. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, existing tuning algorithms (e.g., heuristic based searching and model based searching) have limitations that make such algorithms non-suitable for HVM environments. Accordingly, embodiments disclosed herein include the use of transmission line quantities to construct a vector space that is used to tune the impedance of the system. For example, a u-vector with up to three elements may be used to create a vector field without overlapping quadrant representation in order to optimize transmission line parameters for optimal power transfer from the input to the output of the impedance tuning device. Such a three element vector approach is not computationally burdensome, and allows for real time control of the system in an HVM environment.

Additionally, embodiments are highly scalable. For example, there are no limitations on impedance matching network topology or variants. There is also no need for gain scheduling. Control gains are derived from the reactance of the control surfaces (e.g., the control of variable capacitors). Additionally, there is no limitation on the impedance match architecture. That is, mechanical or solid state variable capacitors may be used in accordance with various embodiments.

Figure 1:
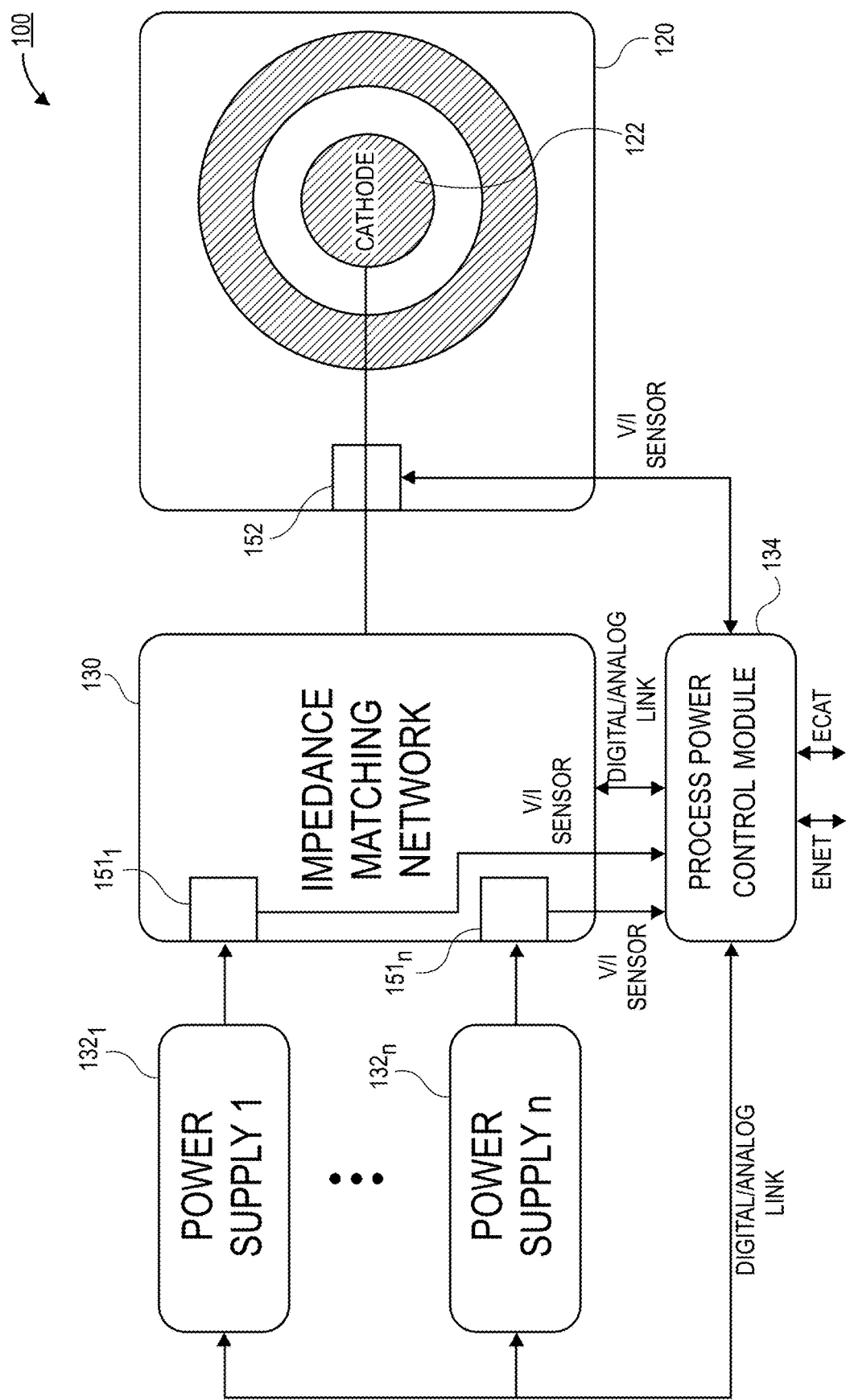
FIG. 1 is a schematic of a plasma processing tool that includes a centralized control architecture, in accordance with an embodiment.

Referring now to FIG. 1, a more detailed schematic of a plasma processing tool 100 is shown, in accordance with an embodiment. In an embodiment, the plasma processing tool 100 includes a plasma chamber 120. The plasma chamber 120 includes a cathode 122 in order to couple the power received to one or more gasses flown into the plasma chamber 120. In an embodiment, the plasma chamber 120 may be suitable for any plasma process typical of semiconductor manufacturing environments. For example, the plasma chamber 120 may be a plasma etching chamber, a plasma deposition chamber, a plasma treatment chamber, or the like. In a particular embodiment, the plasma chamber 120 may be a plasma enhanced chemical vapor deposition (PECVD) chamber, a physical vapor deposition (PVD) chamber, or a plasma enhanced atomic layer deposition (PEALD) chamber.

In an embodiment, the plasma chamber 120 may be coupled to a power delivery architecture. For example, the power delivery architecture may include one or more power supplies $132_1$-$132_n$. In the illustrated embodiment, a plurality of power supplies 132 are shown. However, it is to be appreciated that a single power supply 132 may be used in some embodiments. In an embodiment, the power supplies 132 may include any type of power supply. For example, the power supplies 132 may be RF power supplies, microwave power supplies, direct current (DC) power supplies, pulsed DC power supplies, or the like, or any combination of these power supply types.

In an embodiment, the power supplies 132 may be coupled to the cathode 122 through an impedance matching network 130. The impedance matching network 130 alters the impedance of the power delivery architecture in order to match the load in the chamber 120. Due to changes in processing conditions (e.g. gas flow rates, pressure, temperature, etc.) the impedance of the load can vary. As such, the impedance matching network 130 is used to match the changing impedance in order to provide efficient power delivery into the chamber (i.e., with no or minimal reflected power).

In an embodiment, sensors 151 and 152 may be provided on opposite ends of the impedance matching network 130. For example, sensors $151_1$-$151_n$ may be on an upstream side of the impedance matching network 130, and sensor 152 may be on a downstream side of the impedance matching network 130. The "upstream" side may refer to the input side of the matching network 130, and the "downstream" side may refer to the output side of the matching network 130. As shown, a plurality of sensors $151_1$-$151_n$ are provided on the upstream side of the impedance matching network 130. The number of sensors 151 may be equal to the number of power supplies 132. That is, each power supply 132 may have a dedicated sensor 151. The downstream side of the impedance matching network 130 may have a single sensor 152. However, it is to be appreciated that when there is more than one output from the matching network 130, there may be additional sensors 152. For example, in a case where there is two outputs (e.g., for a center of the chamber 120 and an edge of the chamber 120), there may be two sensors 152.

In the case of multiple sensors 151, the plurality of sensors $151_{1-n}$ may be fabricated on a single PCB. That is, a single module may include multiple sensors. Generally, embodiments described herein include electrical shielding techniques that limit the cross coupling between sensors on a single PCB.

In FIG. 1, the sensors 151 and 152 are shown generally as blocks. However, it is to be appreciated that the sensors 151 and 152 may be similar to any of the sensor architectures described in greater detail below. For example, each sensor 151 and/or 152 may be a transmission line voltage and transmission line current (i.e., V/I) sensor. The transmission line voltage may be detected by an embedded voltage ring, and the transmission line current may be detected by a current loop. In a particular embodiment, the sensor includes an aperture, and a conductive device with concentric electrically insulating material (e.g., an RF cable) passes through the aperture. Features on the sensor are able to pick up the current and voltage passing along the transmission line. For example, a current loop picks up the current, and a voltage ring detects the voltage.

In an embodiment, the sensors 151 and 152 may be communicatively coupled with a process power control module 134. For example, an RF process power control module 134 may be provided in FIG. 1. However, it is to be appreciated that the processing module may be a microwave process power control module 134, a DC process power control module 134, or the like, depending on what type of power supplies 132 are included in the tool 100. In an embodiment, the sensors 151 and 152 deliver the voltage and/or current to the process power control module. In an embodiment, the process power control module 134 may have external connections for different physical layers and protocols, such as an Ethernet (ENET) and a standardized industrial connection, like EtherCAT.

In an embodiment, the process power control module 134 may be coupled to the impedance matching network by a digital/analog link. Through the digital/analog link, the process power control module 134 may be able to send control signals to the impedance matching network 130. For example, control signals may be used to adjust the capacitance of variable capacitors within the impedance matching network 130. Additionally, the process power control module 134 may be coupled to the power supplies 132 by a digital/analog link. As such, the process power control module 134 is capable of coordinated impedance tuning.

Figure 2:
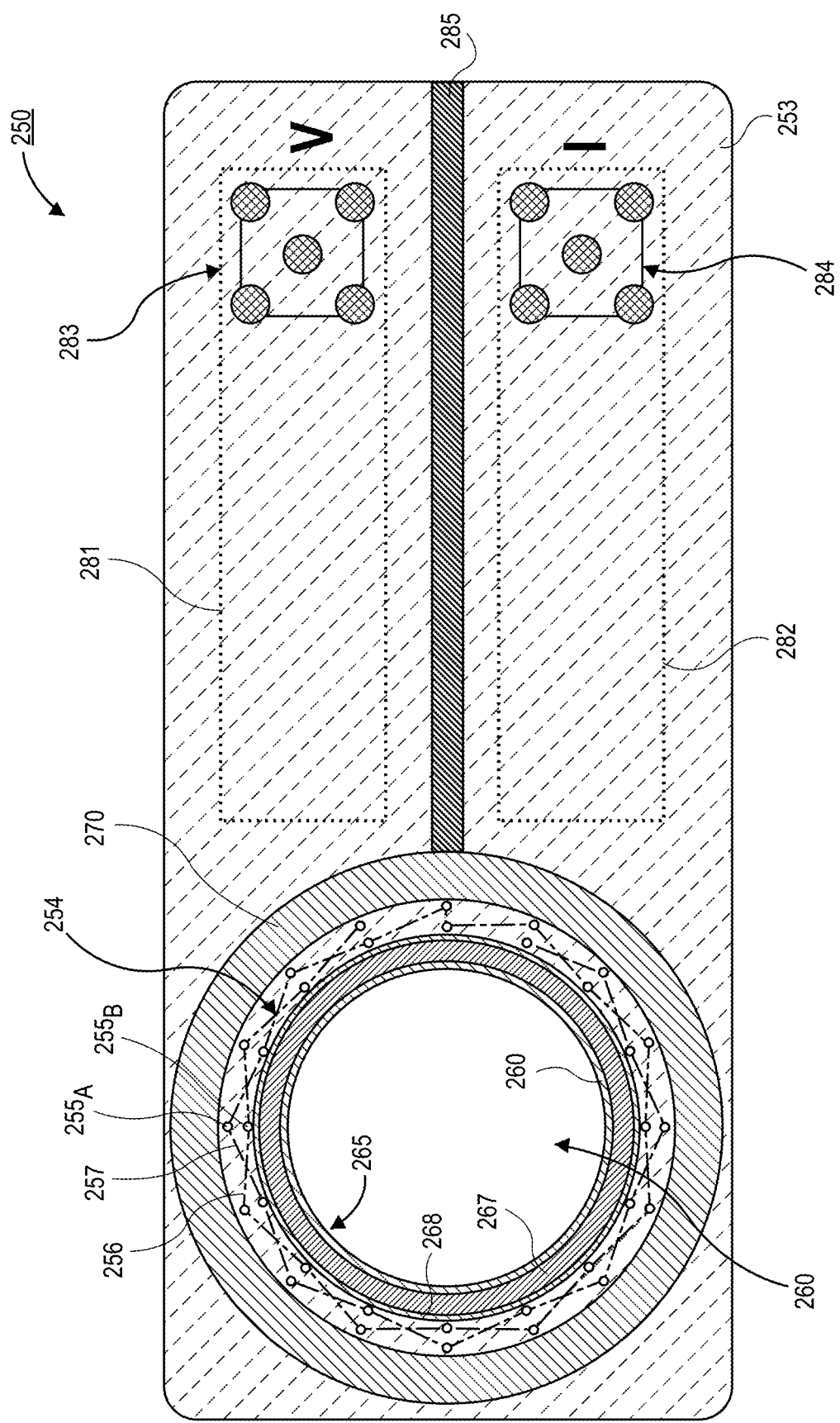
FIG. 2 is a plan view illustration of a sensor with a current loop, a voltage ring, and a guard ring, in accordance with an embodiment.

Referring now to FIG. 2, a plan view illustration of sensor 250 is shown, in accordance with an embodiment. As shown, the sensor 250 is fabricated on a PCB 253. The sensor 250 may include a current loop 254 and a voltage ring 265 within the current loop 254. The current loop 254 and the voltage ring 265 may surround an aperture 260 through the PCB 253.

In an embodiment, the current loop 254 may include inner vias 255B and outer vias 255A. The vias 255 may be coupled to each other by traces 256 on a top surface of the PCB 253 and by traces 257 on a bottom surface of the PCB 253. In the illustrated embodiment, the current loop 254 includes a pair of windings around the aperture 260.

In an embodiment, the voltage ring 265 may include an inner conductive ring 266 and an outer conductive ring 268. An insulating ring 267 may be provided between the inner ring 266 and the outer ring 268. The inner ring 266 may be the voltage pickup surface and the outer ring 268 may be grounded. In an embodiment, the inner ring 266 may define the outer perimeter of the aperture 260.

In an embodiment, the sensor 250 may further comprise a guard ring 270 that surrounds an outer perimeter of the current loop 254. In an embodiment, the guard ring 270 may be grounded. The guard ring 270 may include vias (not shown) that couple the guard ring 270 to a ring on the bottom side of the PCB 253 with a similar size and shape. As such, an electrically shielding barrier is provided around the pickup components of the sensor 250. Accordingly, sensor performance can be increased.

In an embodiment, the voltage ring 265 may be coupled to pickup circuitry 281 on the PCB 253. The pickup circuitry 281 in FIG. 2 is shown schematically as a dashed box. However, it is to be appreciated that the pickup circuitry 281 may include features, such as filters, amplifiers, and the like. In an embodiment, pads 283 are provided. The pads 283 may be suitable for attaching a connector (not shown) in order to feed voltage information back to a processing module, such as the processing module described in greater detail above.

In an embodiment, the current loop 254 may be coupled to pickup circuitry 282 on the PCB 253. The pickup circuitry 282 in FIG. 2 is shown schematically as a dashed box. However, it is to be appreciated that the pickup circuitry 282 may include features, such as filters, amplifiers, and the like. In an embodiment, pads 284 are provided. The pads 284 may be suitable for attaching a connector (not shown) in order to feed current information back to a processing module, such as the processing module described in greater detail above.

In an embodiment, the pickup circuitry 281 is electrically isolated from the pickup circuitry 282. Electrically isolating the two sets of pickup circuitry 281 and 282 enables a reduction in cross-coupling between the two circuits. As such, performance of the sensor 250 may be improved. In an embodiment, the electrical isolation may be provided by a conductive strip 285 that is provided between the two sets of pickup circuitry 281 and 282. In an embodiment, the conductive strip 285 may be grounded. In some embodiments, the conductive strip 285 is electrically coupled to the guard ring 270. The conductive strip 285 may be provided on a top surface of the PCB 253. In other embodiments, vias may be provided below the strip 285 in order to extend the electrical isolation through a thickness of the PCB 253.

Figure 3:
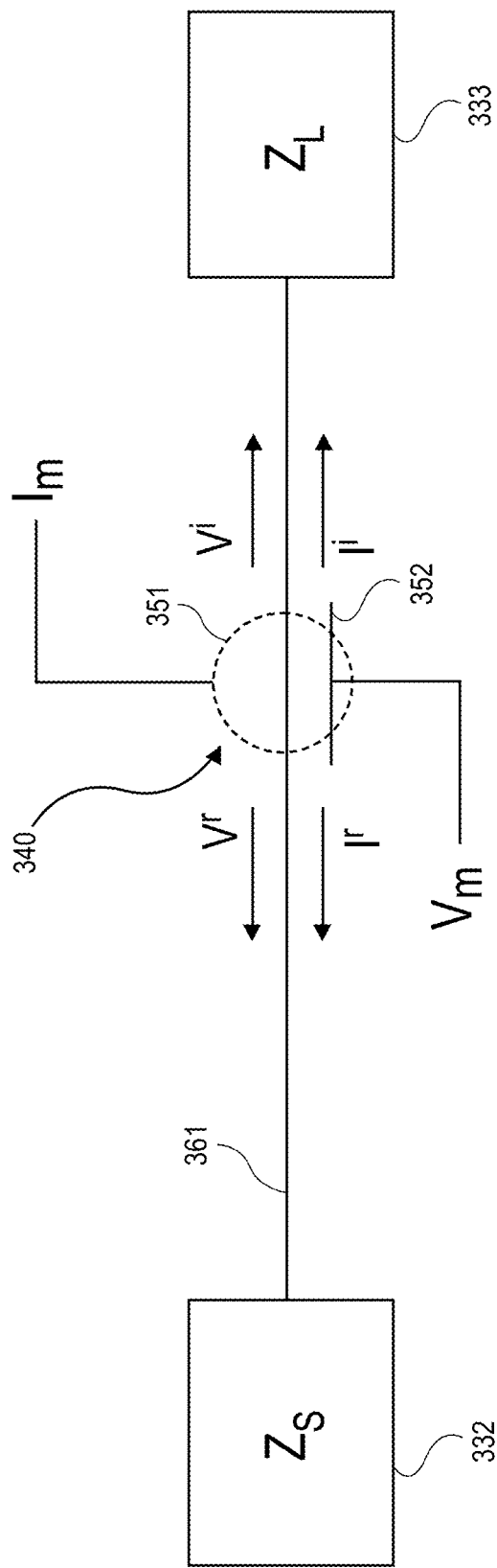
FIG. 3 is a schematic of a transmission line with a sensor for detecting reflected voltage and current and incident voltage and current, in accordance with an embodiment.

Referring now to FIG. 3, a schematic illustration of a transmission line 361 between a power supply 332 and a system load 333 is shown, in accordance with an embodiment. In an embodiment, the power supply 332 may be similar to any of the power supplies 132 described in greater detail above. For example, the power supply 332 may be an RF power supply in some embodiments. In an embodiment, the load 333 may be the load of a plasma processing chamber. For example, a cathode may be coupled to the processing gasses within a plasma chamber. The chamber conditions may dictate the load of the transmission line 361. That is, changes to pressure, temperature, gas flow rates, etc. may result in changes to the load 333 of the transmission line 361. In order to provide efficient power delivery, an impedance matching network (not shown) matches the impedance of the transmission line 361 to the impedance of the load 333.

In an embodiment, the transmission line 361 may include a transmission line sensor 340. The transmission line sensor 340 may be substantially similar to the sensor 250 described in greater detail above. For example, the transmission line sensor 340 may have a magnetic field coupling component 351 and a capacitive coupling component 352. The magnetic field coupling component 351 may be a current loop, and the capacitive coupling component 352 may be a voltage ring, such as those described in greater detail above. The magnetic field coupling component 351 may provide a measured current $I_m$, and the capacitive coupling component 352 may provide a measured voltage $V_m$. In an embodiment, the measured current $I_m$ may include an incident current $I^i$ and a reflected current $I_r$, and the measured voltage $V_m$ may include an incident voltage $V^i$ and a reflected voltage $V^r$. The measured current $I_m$ and the measured voltage $V_m$ may be transmitted to a power processing module (not shown). The power processing module may be communicatively coupled to the impedance matching network. As such, the power processing module may use the measured voltage $V_m$ and the measured current $I_m$ in order to set the proper impedance of the impedance matching network.

Figure 4:
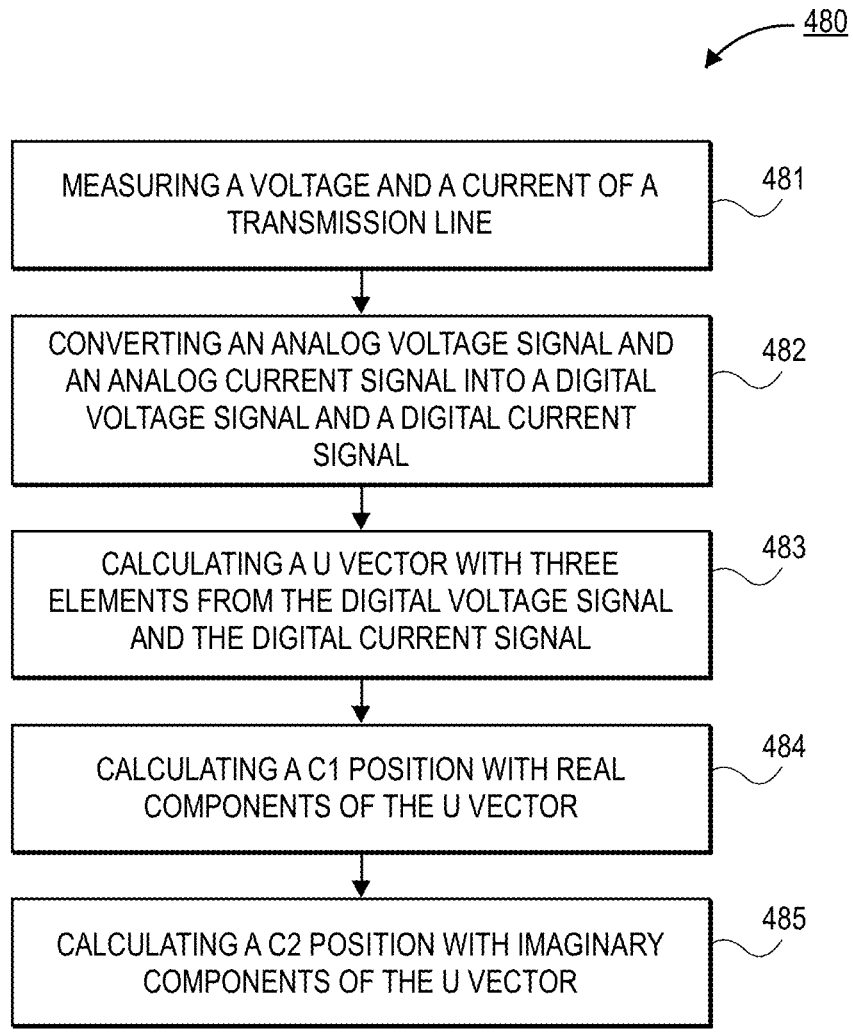
FIG. 4 is a process flow diagram of a process for impedance tuning in a semiconductor processing tool, in accordance with an embodiment.

Referring now to FIG. 4, a process flow diagram of a process 480 for tuning the impedance of a semiconductor processing tool, such as a plasma processing tool, is shown, in accordance with an embodiment. In an embodiment, the process 480 may be executed on a power processing module, such as the process power control module described in greater detail above. The process 480 may result in the identification of the impedance of a load (e.g., a plasma load) and is configured to set the positioning of a first variable capacitor and a second variable capacitor in an impedance matching network to match the impedance of a transmission line to the impedance of the load.

In an embodiment, process 480 begins with operation 481, which includes measuring a voltage and a current of a transmission line. In an embodiment, the measured voltage and the measured current may include both an incident portion and a reflected portion. For example, the measured voltage may comprise a reflected voltage ($V^r$) and an incident voltage ($V^i$). Similarly, the measured current may comprise a reflected current ($I^r$) and an incident current ($I^i$).

The measured current and the measured voltage may be detected by sensors, such as sensors 250 described in greater detail above. For example, the sensor or sensors may include a current loop and a voltage ring. In an embodiment, the sensor is located along the transmission line between a power supply and a load (e.g., a plasma load). In some embodiments, the sensor or sensors are located before an impedance matching network, after an impedance matching network, and/or before and after an impedance matching network. While described herein as a single sensor, it is to be appreciated that multiple sensors may be used in accordance with various embodiments described herein.

In an embodiment, process 480 may continue with operation 482, which comprises converting an analog voltage signal and an analog current signal into a digital voltage signal and a digital current signal. The conversion from analog to digital may be implemented in the power processing module (e.g., similar to the RF process power control module described above). For example, the conversion may be made with an analog to digital converter (ADC) or the like.

In an embodiment, the process 480 may continue with operation 483, which comprises calculating a u-vector with three elements from the digital voltage signal and the digital current signal. In an embodiment, the three elements of the u-vector may calculated using Equations 1-3.

$$u_{2,i}|u_{3,i}|^2 = \frac{V^r_{x,f} I^r_{x,f}}{V^i_{x,f} I^i_{x,f}} \qquad \text{Equation 1}$$

$$u_{2,i} = \frac{V^r_{x,f}}{V^i_{x,f}} \qquad \text{Equation 2}$$

$$u_{3,i} = \frac{I^r_{x,f}}{I^i_{x,f}} \qquad \text{Equation 3}$$

In an embodiment, the process 480 may continue with operation 484, which comprises calculating a C1 position with real components of the u-vector. The C1 position is a position of a first variable capacitor within an impedance matching network. While referred to as having a "position" it is to be appreciated that the first variable capacitor may be a solid state capacitor, and there may not be mechanical positioning used to set the capacitance of the first variable capacitor. In an embodiment, the C1 position may be calculated using Equation 4.

$$C_{1,i+1} = C_{1,i} + \alpha \mathfrak{R}(du_{i-1}{}^T)$$ Equation 4

In Equation 4, a is a gain value, $\mathfrak{R}$ is a real value component of the u-vector, d is a second vector to provide a linear combination of the u-vector via a dot product, and an angular rotation component, and $u_{i-1}{}^T$ is the transpose of the u-vector. In an embodiment, a takes a value corresponding to the reactance range of the first variable capacitor.

In an embodiment, the process 480 may continue with operation 485, which comprises calculating a C2 position with imaginary components of the u-vector. The C2 position is a position of a second variable capacitor within an impedance matching network. While referred to as having a "position" it is to be appreciated that the second variable capacitor may be a solid state capacitor, and there may not be mechanical positioning used to set the capacitance of the second variable capacitor. In an embodiment, the C2 position may be calculated using Equation 5.

$$C_{2,i+1} = C_{2,i} + \beta \mathfrak{I}(du_{i-1}{}^T)$$ Equation 5

In Equation 4, β is a gain value, $\mathfrak{I}$ is an imaginary value component of the u-vector, d is a second vector to provide a linear combination of the u-vector via a dot product, and an angular rotation component, and $u_{i-1}{}^T$ is the transpose of the u-vector. In an embodiment, p takes a value corresponding to the reactance range of the second variable capacitor. Generally, α/β is the ratio of the C1 range to the C2 range. In an embodiment, proper C1 and C2 positioning minimizes the elements of u, and as any numerator term of u→0, a tuned condition occurs for optimal power transfer from the input to the output.

It is to be appreciated that up to a three element vector u results in the formation of a vector field without overlapping quadrant representation to optimize transmission line parameters for optimal power transfer from the input to the output of the impedance tuning device. Additionally, the computational burden of such methods is significantly lower than other tuning algorithms (e.g., heuristic search algorithms and model based algorithms). Accordingly, embodiments such as those described herein allow for computation and operation in a real time control system. Furthermore, such embodiments are easily scalable and not limited to a single architecture. For example, there is no limitation on impedance matching network topology or variants. Additionally, there is no need for gain scheduling. Instead, control gains are derived from the reactance of the control surfaces. In yet another embodiment, it is to be appreciated that there is no limitation on the impedance math type. For example, mechanical or solid state variable capacitors may be used in the impedance matching network, in accordance with various embodiments.

Figure 5:
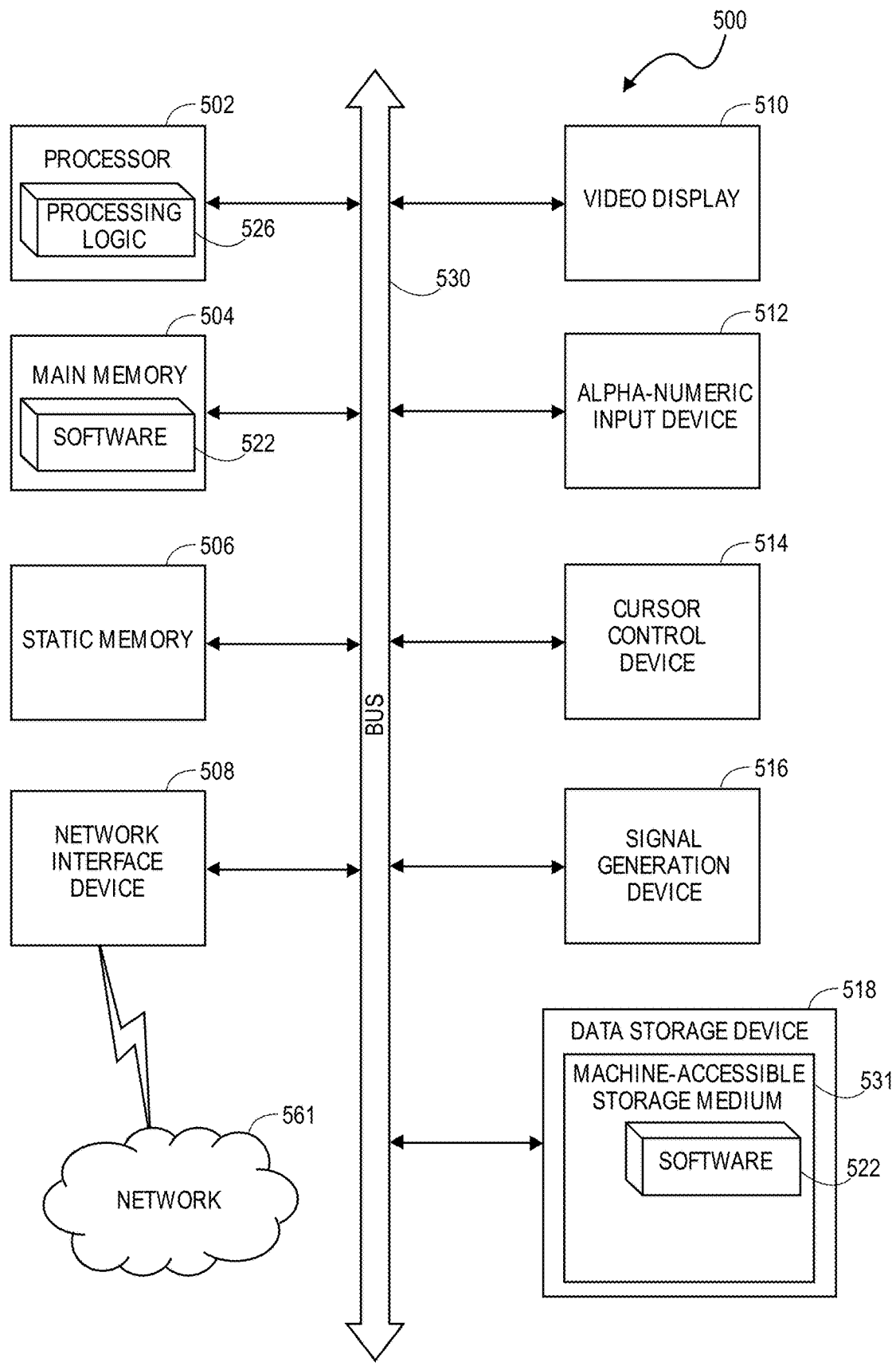
FIG. 5 illustrates a block diagram of an exemplary computer system that may be used in conjunction with a processing tool, in accordance with an embodiment.

Referring now to FIG. 5, a block diagram of an exemplary computer system 500 of a processing tool is illustrated in accordance with an embodiment. In an embodiment, computer system 500 is coupled to and controls processing in the processing tool. Computer system 500 may be connected (e.g., networked) to other machines in a Local Area Network (LAN), an intranet, an extranet, or the Internet. Computer system 500 may operate in the capacity of a server or a client machine in a client-server network environment, or as a peer machine in a peer-to-peer (or distributed) network environment. Computer system 500 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 500, the term "machine" shall also be taken to include any collection of machines (e.g., computers) that individually or jointly execute a set (or multiple sets) of instructions to perform any one or more of the methodologies described herein.

Computer system 500 may include a computer program product, or software 522, having a non-transitory machine-readable medium having stored thereon instructions, which may be used to program computer system 500 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 500 includes a system processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

System processor 502 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 502 may also be one or more special-purpose processing devices such as an application specific integrated circuit (ASIC), a field programmable gate array (FPGA), a digital signal system processor (DSP), network system processor, or the like. System processor 502 is configured to execute the processing logic 526 for performing the operations described herein.

The computer system 500 may further include a system network interface device 508 for communicating with other devices or machines. The computer system 500 may also include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium 532 (or more specifically a computer-readable storage medium) on which is stored one or more sets of instructions (e.g., software 522) embodying any one or more of the methodologies or functions described herein. The software 522 may also reside, completely or at least partially, within the main memory 504 and/or within the system processor 502 during execution thereof by the computer system 500, the main memory 504 and the system processor 502 also constituting machine-readable storage media. The software 522 may further be transmitted or received over a network 520 via the system network interface device 508. In an embodiment, the network interface device 508 may operate using RF coupling, optical coupling, acoustic coupling, or inductive coupling.

While the machine-accessible storage medium 532 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method of impedance tuning in a semiconductor processing tool, comprising:
   measuring a voltage and a current of a transmission line;
   converting an analog voltage signal of the measured voltage and an analog current signal of the measured current into a digital voltage signal and a digital current signal;
   calculating a u-vector from the digital voltage signal and the digital current signal, the u-vector having real components and imaginary components;
   calculating a C1 position of a first capacitor with the real components of the u-vector; and
   calculating a C2 position of a second capacitor with the imaginary components of the u-vector.

2. The method of claim 1, wherein the u-vector is a three element vector.

3. The method of claim 2, wherein the three elements of the u-vector yield an orientation within an impedance tune space to match an output load condition of the semiconductor processing tool.

4. The method of claim 1, wherein the voltage comprises an incident voltage and a reflected voltage, and wherein the current comprises an incident current and a reflected current.

5. The method of claim 1, wherein C1 and C2 positioning minimize the elements of the u-vector to drive the u-vector to 0.

6. The method of claim 5, wherein the u-vector being 0 is a tuned condition of the tool.

7. The method of claim 1, wherein calculating the C1 and C2 positions includes taking the dot product of the u-vector and a d-vector.

8. The method of claim 7, wherein the d-vector includes an angular rotation component.

9. The method of claim 1, wherein the first capacitor and the second capacitor are within a matching network.

10. The method of claim 1, wherein the semiconductor processing tool is a plasma processing tool.

11. The method of claim 1, wherein the semiconductor processing tool includes a power supply, a matching network, and a cathode, and wherein sensors for measuring the voltage and the current of the transmission line are provided on opposite ends of the matching network.

12. A method of impedance tuning in a semiconductor processing tool, comprising:
    measuring a voltage and a current of a transmission line, wherein the voltage comprises an incident voltage and a reflected voltage, and wherein the current comprises an incident current and a reflected current;
    converting an analog voltage signal of the measured voltage and an analog current signal of the measured current into a digital voltage signal and a digital current signal;
    calculating a u-vector from the digital voltage signal and the digital current signal, wherein the u-vector is a three element vector, the u-vector having real components and imaginary components;
    calculating a C1 position of a first capacitor with the real components of the u-vector; and
    calculating a C2 position of a second capacitor with the imaginary components of the u-vector, and wherein the three elements of the u-vector yield an orientation within an impedance tuning space to match an output load condition of the semiconductor processing tool.

13. The method of claim 12, wherein calculating the C1 and C2 positions includes taking the dot product of the u-vector and a d-vector.

14. The method of claim 13, wherein the d-vector includes an angular rotation component.

* * * * *